(12) United States Patent
Despont et al.

(10) Patent No.: US 9,611,134 B2
(45) Date of Patent: *Apr. 4, 2017

(54) NANO-ELECTROMECHANICAL SWITCH

(71) Applicant: INTERNATIONAL BUSINESS MACHINES CORPORATION, Armonk, NY (US)

(72) Inventors: Michel Despont, Zurich (CH); Daniel Grogg, Zurich (CH); Armin W. Knoll, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,299

(22) Filed: Apr. 27, 2015

(65) Prior Publication Data
US 2015/0232324 A1 Aug. 20, 2015

Related U.S. Application Data

(63) Continuation of application No. 13/706,482, filed on Dec. 6, 2012, now Pat. No. 9,041,499.

(30) Foreign Application Priority Data

Dec. 7, 2011 (EP) .................................. 11192336

(51) Int. Cl.
*H01H 51/22* (2006.01)
*B81B 3/00* (2006.01)
*B81C 99/00* (2010.01)

(52) U.S. Cl.
CPC .......... *B81B 3/0027* (2013.01); *B81C 99/006* (2013.01); *B81B 2203/0118* (2013.01)

(58) Field of Classification Search
CPC .................................................. H01H 59/0009
(Continued)

(56) References Cited

U.S. PATENT DOCUMENTS 5,367,136 A * 11/1994 Buck .................... H03K 17/975
200/181
6,646,215 B1 * 11/2003 Nelson .................. B81B 3/0008
200/181

(Continued)

FOREIGN PATENT DOCUMENTS

| WO | WO0073839 A1 | 12/2000 |
| WO | WO2005104717 A2 | 11/2005 |
| WO | WO2011121531 A1 | 10/2011 |

OTHER PUBLICATIONS

Parsa et al., "Nano-electromechanical relays with decoupled electrode and suspension," IEEE MEMS Conference, Jan. 23-27, 2011, pp. 1361-1364, Cancun Mexico.

(Continued)

*Primary Examiner* — Alexander Talpalatski
(74) *Attorney, Agent, or Firm* — Tutunjian & Bitetto, P.C.; Jennifer R. Davis

(57) ABSTRACT

A nano-electromechanical switch and a method for designing a nano-electromechanical switch. The nano-electromechanical switch includes at least one actuator electrode and a curved cantilever beam. The curved cantilever beam is adapted to flex in response to an activation voltage applied between the actuator electrode and the curved cantilever beam to provide an electrical contact between the curved cantilever beam and an output electrode of the nano-electromechanical switch. Before, during and after the curved cantilever beam flex in response to the activation voltage, a remaining gap between the curved cantilever beam and the actuator electrode is uniform.

17 Claims, 5 Drawing Sheets

(58) Field of Classification Search
USPC .......................................... 335/78; 200/181
See application file for complete search history.

(56) References Cited

U.S. PATENT DOCUMENTS

| | | | |
|---|---|---|---|
| 7,064,637 B2 | 6/2006 | Tactic-Lucic et al. | |
| 7,342,472 B2* | 3/2008 | Charvet | H01H 1/0036 |
| | | | 200/181 |
| 7,349,236 B2* | 3/2008 | Lin | B82Y 10/00 |
| | | | 365/129 |
| 7,352,266 B2* | 4/2008 | Chou | B81C 1/00611 |
| | | | 200/181 |
| 7,362,199 B2* | 4/2008 | Chou | H01H 59/0009 |
| | | | 200/181 |
| 7,545,234 B2* | 6/2009 | Chou | B81C 1/00611 |
| | | | 200/181 |
| 7,558,103 B2* | 7/2009 | Nakamura | B82Y 10/00 |
| | | | 365/151 |
| 7,924,122 B2 | 4/2011 | Chou et al. | |
| 7,965,159 B2* | 6/2011 | Nakatani | H01H 59/0009 |
| | | | 200/181 |
| 8,003,906 B2* | 8/2011 | Ebeling | H01H 59/0009 |
| | | | 200/181 |
| 8,450,625 B2* | 5/2013 | Fujita | G11C 13/025 |
| | | | 200/181 |
| 2002/0153583 A1* | 10/2002 | Frazier | G11C 23/00 |
| | | | 257/448 |
| 2003/0058069 A1 | 3/2003 | Schwartz et al. | |
| 2005/0183938 A1* | 8/2005 | Chou | B81C 1/00611 |
| | | | 200/181 |
| 2005/0219016 A1* | 10/2005 | Chou | H01H 59/0009 |
| | | | 335/78 |
| 2007/0057278 A1* | 3/2007 | Nakamura | B82Y 10/00 |
| | | | 257/107 |
| 2007/0211525 A1* | 9/2007 | Nakamura | B82Y 10/00 |
| | | | 365/164 |
| 2008/0283374 A1* | 11/2008 | Naito | H01H 1/18 |
| | | | 200/181 |
| 2009/0215213 A1 | 8/2009 | Chou | |
| 2009/0314616 A1* | 12/2009 | Oberhammer | H01H 59/0009 |
| | | | 200/181 |
| 2010/0051428 A1* | 3/2010 | Ikehashi | H01H 59/0009 |
| | | | 200/181 |

OTHER PUBLICATIONS

Despont et al., "International Search Report and Written Opinion" Patent Cooperation Treaty, issued in International Application No. PCT/IB2012/056489 on Jul. 11, 2013 (7 pages).

Despont et al., "International Preliminary Report on Patentability" Patent Cooperation Treaty, issued in International Application No. PCT/IB2012/056489 on Feb. 7, 2014 (29 pages).

* cited by examiner

NANO-ELECTROMECHANICAL SWITCH

CROSS-REFERENCE TO RELATED APPLICATION

This application is a Continuation of co-pending U.S. patent application Ser. No. 13/706,482 filed on Dec. 6, 2012, which is incorporated herein by reference in its entirety. This application claims priority under 35 U.S.C. §119 from European Patent Application No. 11192336.3 filed Dec. 7, 2011, the entire contents of which are incorporated herein by reference.

BACKGROUND OF THE INVENTION

Field of Invention

More particularly, the present invention is related to a nano-electromechanical switch and to a method for designing such a nano-electromechanical switch.

Description of the Related Art

As power and energy constraints in microelectronic applications become more challenging an alternative and more power efficient ways of switching and computing is desired. A conventional switching device used in the semiconductor industry is a C-MOS transistor. To overcome power related power bottlenecks in C-MOS devices switching devices, which operate on fundamentally different transport mechanisms such as tunneling, are investigated. However, combining the desirable characteristics of high on-current, very low off-current, abrupt switching, high speed as well as a small footprint in a device that might be easily interfaced to a C-MOS device is a challenging task. Mechanical switches such as nano-electromechanical switches (NEM switches) are promising devices to meet these kinds of criteria. A nano-electromechanical switch has a narrow gap between electrodes and is controlled by electrostatic actuation. In response to an electrostatic force, a contact electrode can be bent to contact another electrode and therefore close the switch. A main issue in designing and operating nano-electrochemical switches is to control the narrow gap for the electrostatic actuation and for the electrical contact separation. A nano-electromechanical switch has to meet both requirements of high switching speed and low actuation voltage.

Common electromechanical switches use straight cantilever beams as switching elements, which is not the best solution to meet these requirements.

FIG. 1A and FIG. 1B illustrate the structure of a conventional nano-electromechanical switch having a straight cantilever beam CB. FIG. 1A shows a straight cantilever beam CB being in an initial position IP and being attracted by an actuation electrode AE when an activation voltage is applied between the actuator electrode and the cantilever beam CB. In a contact position CP the distal end of the cantilever beam CB contacts an output electrode and provides an electrical contact between the cantilever beam CB and the output electrode of the nano-electromechanical switch. Referring to FIG. 1A, the flexing of the cantilever beam CB is distributed over the whole beam length. As a result, the remaining gap between the cantilever beam CB and the actuator electrode AE is uneven and not uniform. The remaining gap becomes very small leading to high electrical field E close to the distal end, which leads to a low robustness due to electrical or mechanical breakdown. Referring to FIG. 1B, the robustness of the nano-electromechanical switch has a straight cantilever beam CB, which can be improved by increasing the width of the cantilever beam CB. However, the straight cantilever beam CB still results in a strong electrical field E when the actuator electrode AE is placed close to the contact point between the cantilever beam CB and the output electrode OE as described in R. Parsa, M. Shawezipur, W. S. Lee, S. Chong, D. Lee, H. S. P. Wong, R. Marboudian, R. T. Howe "Nano-electromechanical relays with decoupled electrode and suspension" IEEE MEMS conference, 2011.

To increase the robustness of the nano-electromechanical switch, a parallel motion switch has been proposed. As depicted in FIG. 2, to obtain high robustness the force $F_{el}$ between the actuation electrode AE and the cantilever beam CB in the closed state is minimized in order to avoid a pull-in of the cantilever beam CB onto the actuation electrode AE. This is done by minimizing the electrical field E, which is equivalent to the force $F_{el}$ by adapting the angle β (β=90−α) between the direction of motion DOM and the actuator electrode AE.

$$gap_R = \left(\frac{gap_0}{\cos(\alpha)} - gap_0\right) \cdot \cos(\alpha) \tag{1}$$

$$V_{pi} = \sqrt{\frac{8}{27} \frac{k_m gap_0^3}{\varepsilon_0 A_{el}} \cdot \cos(\alpha)} \tag{2}$$

$$E_{max} \geq \frac{V_{pi}}{gap_R} \tag{3}$$

where $gap_0$ is the initial gap between the distal end of the cantilever beam CB and the output electrode OE,
$gap_R$ is the remaining gap in the closed state of the nano-electromechanical switch,
$k_m$ is a mechanical spring constant,
$\varepsilon_0$ is the dielectric permittivity of air and
$E_{max}$ is the electric field strength in a closed state of the nano-electromechanical switch,
$V_{pi}$ is the pull-in voltage,
$A_{el}$ is the area of the electrode, and
α is an inclination angle of the cantilever beam CB.

Referring to FIG. 2, the actuation electrode AE has an inclination angle α with respect to the direction of motion DOM to avoid a complete closure and a shortcut of the actuation electrode with the inclined cantilever beam. The disadvantage of a conventional parallel motion switch is that to ensure a parallel motion such a nano-electromechanical switch as shown in FIG. 2, is large and not suited for VLSI NEM switch technology.

SUMMARY OF THE INVENTION

One aspect of the present invention provides a nano-electromechanical switch is provided which includes at least one actuator electrode. The nano electromechanical switch further includes a curved cantilever beam. The curved cantilever beam is adapted to flex in response to an activation voltage applied between the actuator electrode and the curved cantilever beam to provide an electrical contact between the curved cantilever beam and an output electrode of the nano-electromechanical switch. Before, during and after the curved cantilever beam flex in response to the activation voltage, a remaining gap between the curved cantilever beam and the actuator electrode remains uniform.

Another aspect of the present invention provides a method for designing a nano-electromechanical switch including the step of adapting a curved cantilever beam to rotate around a point of rotation, in response to an activation voltage applied between an actuator electrode and the curved cantilever beam. The method further includes providing an electrical contact between the curved cantilever beam and an output electrode of the nano-electromechanical switch. After the rotation of the curved cantilever beam a remaining gap between the curved cantilever beam and the actuator electrode remains uniform.

Another aspect of the present invention provides a computer readable non-transitory article of manufacture tangibly embodying computer readable instructions which, when executed, cause a computer to carry out the steps according to the above-mentioned method.

BRIEF DESCRIPTION OF DRAWINGS

The following aspects of the present invention of the nano-electromechanical switch and of a method for designing a nano-electromechanical switch are described with reference to the enclosed Figures.

DETAILED DESCRIPTION OF PREFERRED EMBODIMENTS

Figure 3:
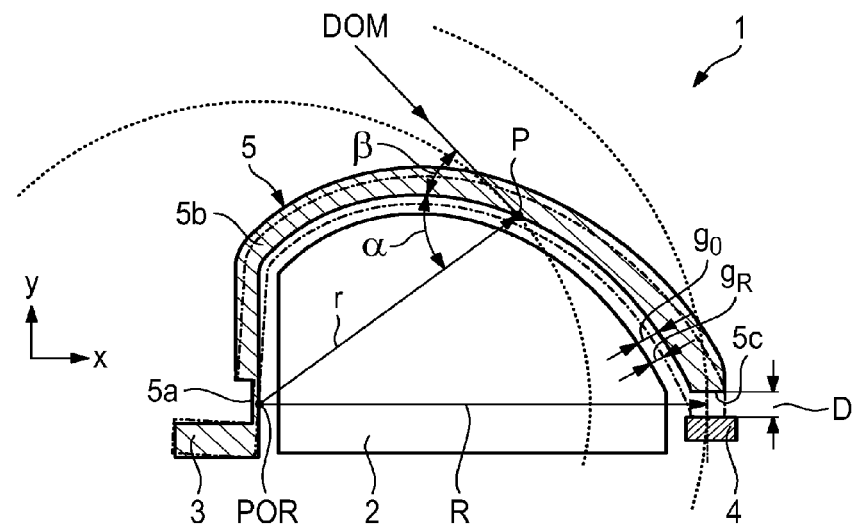
FIG. 3 shows a nano-electromechanical switch according to an embodiment of the present invention.

One aspect of the present invention, as shown in FIG. 3, is a nano-electromechanical switch 1 that includes different electrodes. The nano-electromechanical switch 1 includes a layout to enable an optimal control and a high robustness of the nano-electromechanical switch. Referring to FIG. 3, the nano-electromechanical switch 1 includes an actuator electrode 2 and a fixed anchor forming a source input electrode 3. The input electrode 3 is connected via a flexible hinge portion 5a to a main body portion 5b. The flexible hinge portion 5a and the main body portion 5b form a cantilever beam 5 being connected to the source input electrode 3 of the nano-electromechanical switch 1. The cantilever beam 5 includes the flexible hinge portion 5a, the main body portion 5b and a tip portion 5c facing in the open state of the nano-electromechanical switch 1 an output electrode 4 of the nano-electromechanical switch 1.

Referring to FIG. 3, the nano-electromechanical switch 1, switches between an open state and a closed state. In the closed state of the nano-electromechanical switch 1, the tip portion 5c of the curved cantilever beam 5 abuts the output electrode 4 which connects the input electrode 3 via the cantilever beam 5 electrically with the output electrode 4 so that the nano-electromechanical switch 1 is switched on. In the open state of the nano-electromechanical switch 1, the portion 5c of the cantilever beam 5 is located at a distance D to the output electrode 4. In response to an activation voltage or pull-in voltage applied between the actuator electrode 2 and the curved cantilever beam 5, the curved cantilever beam 5 is pulled towards the actuator electrode 2 so that the tip portion 5c of the cantilever beam 5 contacts the output electrode 4 of the nano-electromechanical switch 1. When applying a predetermined actuation voltage high enough to overcome the mechanical force, for example, at least equal to the pull-in voltage $V_{pi}$, the curved cantilever beam 5 is rotated around the point of rotation so that the curved cantilever beam 5 provides an electrical contact between the input electrode 3 and the output electrode 4 of the nano-electromechanical switch 1. Referring to FIG. 3 the point of rotation POR is formed by the flexible hinge portion 5a of the cantilever beam 5. In FIG. 3 there is a gap between the curved cantilever beam 5 and the actuator electrode 2. When no pull-in voltage is applied between the actuator electrode 2 and the cantilever beam 5 there is an initial gap go between the cantilever beam 5 and the actuator electrode 2. After applying a pull-in voltage between the actuator electrode 2 and the cantilever beam 5, the tip portion 5c of the cantilever beam 5 touches the surface of the output electrode 4 and a closed state actuation gap $g_R$ remains between the cantilever beam 5 and the actuator electrode 2 as in FIG. 3.

In a further embodiment of the present invention the initial gap go between the curved cantilever beam 5 and the actuator electrode 2 is determined by the thickness of a sacrificial layer provided during fabrication of the nano-electromechanical switch 1. FIG. 3 shows that the cantilever beam 5 includes the flexible hinge portion 5a and the main body portion 5b.

In a further embodiment of the present invention the main body portion 5b is mechanically stiffer than the hinge portion 5a and performs a circular motion around the flexible hinge portion 5a in response to the activation voltage applied between the actuator electrode 2 and the curved cantilever beam 5. Accordingly, the cantilever beam 5 includes the hinge 5a portion flexing under the applied force and acting as a point of rotation POR. The main body portion 5b of the cantilever beam 5 is designed to be mechanically stiffer than the hinge portion 5a. Therefore, it does contribute only marginally to the flexing motion but describes a circular motion around the hinge portion 5a forming the point of rotation POR. The nano-electromechanical switch 1, referring to FIG. 3 is designed such that in its closed state the remaining gap $g_R$ forms a closed state actuation gap CSAG which is substantially uniform along the actuator electrode 2 so that no regions with high electric fields exist. In FIG. 3 a maximum radius r of the curved cantilever beam 5 is formed by the distance between the tip portion 5c of the cantilever beam 5 and the point of rotation POR 5a of the cantilever beam 5. A radius r is defined by the distance between a point P on the lower surface of the curved cantilever beam 5 facing the actuator electrode 2 and the point of rotation POR of the cantilever beam 5. The radius r (r<R) is the distance between the point of rotation POR to an arbitrary point on the lower surface of the cantilever beam 5 facing the actuator electrode 2. Referring to FIG. 3, there is a motion direction angle β forming the angle between the direction of motion DOM of the cantilever beam 5 and the radius r at the point of intersection P where the radius r intersects the lower surface of the cantilever beam 5 facing the actuator electrode 2. The direction of motion DOM is given by a tangent to a circle drawn around the point of rotation POR. There is a normal angle α between a direction normal of the direction of motion DOM of the curved cantilever beam 5 around the point of rotation POR and the lower surface of the cantilever beam 5 facing the actuator electrode 2. The sum of the motion direction angle β and the normal angle α is 90° (α+β=90°).

Referring to FIG. 3, when applying a sufficient actuator voltage (>pull-in voltage $V_{pi}$) between the actuator electrode 2 and the curved cantilever beam 5 the curved cantilever beam 5 is rotated around the point of rotation POR from its initial position to a contact position where the tip portion 5c contacts the output electrode 4 of the nano-electromechanical switch 1. After rotation of the curved cantilever beam 5 the remaining gap $g_R$ between the curved cantilever beam 5 and the actuator electrode 2 is substantially uniform. By providing a uniform remaining gap between the cantilever beam 5 and the actuator electrode 2 it can be avoided that there are regions having a very high electric field E between the curved cantilever beam 5 and the actuator electrode 2 so that the nano-electromechanical switch 1 shows a high robustness.

In a further embodiment of the present invention the motion direction angle β of the nano-electromechanical switch 1, between the direction of motion DOM of the curved cantilever beam 5 around the point of rotation POR and the lower surface of the curved cantilever beam 5 facing the actuator electrode 2, is such that after rotation of the curved cantilever beam 5 the remaining gap between the curved cantilever beam 5 and the actuator electrode 2 is substantially constant. In this embodiment the angle is adapted to result in a constant closed state actuation gap CSAG.

In a further embodiment of the present invention is where the motion direction angle β between the direction of motion DOM of the curved cantilever beam 5 around the point of rotation POR at the surface of the curved cantilever beam 5 facing the actuator electrode 2 is substantially constant. In this embodiment a fixed angle is kept constant along the actuator electrode 2.

In a further embodiment of the present invention is where the point of rotation POR is defined as the center of the flexible hinge portion 5a of the cantilever beam 5. The prior aspect of the nano-electromechanical switch 1 where the angle is adapted to result in a constant closed state actuation gap CSAG provides a smaller footprint of the design so that the size of the nano-electromechanical switch 1 is smaller compared to the this aspect of the present invention. According to the present invention the motion direction angle β is designed such that after rotation of the curved cantilever beam 5 the remaining gap CSAG between the curved cantilever beam 5 and the actuator electrode 2 is substantially constant or the motion direction angle β between direction of motion DOM of the curved cantilever beam 5 around the point of rotation POR and the surface of the curved cantilever beam 5 facing the actuator electrode 2 is substantially kept constant.

In a further embodiment of the present invention includes a constant motion direction angle. The motion direction angle β is maintained equal to 30 degrees along the main body portion 5b of the cantilever beam 5. This angle of β=30° results in a very low electrical field E. The optimal angle of 30° between the lower surface and the direction of motion DOM results in a gap of 0, 5 times the initial gap at the tip portion 5c of the cantilever beam 5 and provides at the same time an optimal configuration with minimal energy dissipation in the gap. The optimal angle necessary between the direction of motion DOM and the surface of the actuation electrode 2 provides for high robustness and a low pull-in voltage that can be derived and applied to the cantilever beam design. In a specific design a large actuator electrode 2 is combined to offer a low pull-in voltage and an angle of 30° to reduce or minimize the forces in the closed state of the nano-electromechanical switch 1 and therefore offers a high robustness of the nano-electromechanical switch 1.

In a further embodiment of the present invention the flexing occurs mainly in a hinge portion of the cantilever beam connecting the curved cantilever beam with an input electrode of the nano-electromechanical switch and the motion of the curved cantilever beam can be approximated as a rotation around the point of rotation formed by the flexible hinge.

In a further embodiment of the present invention the flexing occurs along the curved cantilever and the shape of the curved cantilever is modified to take the different behavior in motion into account, resulting in a behavior close or equal to an embodiment where the motion of the curved cantilever can be approximated as rotation.

In a further embodiment of the present invention a motion direction angle between a direction of motion of the curved cantilever beam around the point of rotation and a surface of the curved cantilever beam facing the actuation electrode is such that after rotation of the curved cantilever beam the remaining gap between the curved cantilever beam and the actuator electrode is substantially constant.

In a further embodiment of the present invention a motion direction angle between a direction of motion of the curved cantilever beam around the point of rotation and a surface of the curved cantilever beam facing the actuation electrode is substantially constant.

In a further embodiment of the present invention the cantilever beam includes the flexible hinge portion and a main body portion being mechanically stiffer than the hinge portion performing a circular motion around the flexible hinge portion in response to the activation voltage applied between the actuator electrode and the curved cantilever beam.

In a further embodiment of the present invention an initial gap between the curved cantilever beam and the actuator electrode is determined by a thickness of a sacrificial layer used during fabrication of the nano-electromechanical switch.

In a further embodiment of the present invention the motion direction angle between the direction of motion of the curved cantilever beam around the point of rotation and the surface of the curved cantilever beam facing the actuator electrode is along a main body portion of the cantilever beam substantially equal to 30 degrees.

In a further embodiment of the present invention two or more actuation electrodes are designed to act on the curved cantilever beam such that either their combined actuation or a single electrode actuation results in a contact of the tip with the output electrode forming a logical function between the two inputs and that the remaining gap over all electrodes remains substantially uniform before and after the motion.

In a further embodiment of the present invention two or more actuation electrodes act on the curved cantilever beam from different directions such that specific combinations of the actuation result in a contact of the tip with one of the two output electrodes forming a logic state that depends on multiple entries and that the remaining gap over all electrodes remains substantially uniform before and after the motion.

In a further embodiment of the present invention a four terminal device is designed where a tip element is electrically isolated from the curved cantilever beam, creating an electrical contact between the input electrode and the output electrode in its closed state.

In comparison to other designs, the design of the nano-electromechanical switch 1 tolerates a larger range of operating voltages while the pull-in voltage does not increase. In the present invention, the design of the nano-electromechanical switch 1 overcomes the inherent limitations of straight beam structures as illustrated in connection with FIGS. 1A and 1B by designing the curved cantilever beam 5 in an optimized way. Depending on the desired robustness of the nano-electromechanical switch 1, an angle between the direction of motion DOM and the electrode surface can be increased to reduce a consumed silicon area upon integration of the nano-electromechanical switch 1. The mechanical force between the actuator electrode 2 and the cantilever beam 5 in the closed state of the nano-electromechanical switch 1 is minimized for a higher robustness in order to avoid a catastrophic pull-in of the cantilever beam 5 onto the actuator electrode 2 causing a shortcut. As shown in FIG. 3, the curved cantilever beam 5 includes different portions where the main body portion 5b is curved and includes arc-shaped band form.

The present invention further provides a method for designing a nano-electromechanical switch 1 as shown in FIG. 3. The actuator electrode 2 and the curved cantilever beam 5 are adapted to rotate around a point of rotation POR formed in a possible implementation by the flexible hinge portion 5a of the curved cantilever beam 5. The curved cantilever beam 5 is adapted to rotate around the point of rotation POR and responds to an activation pull-in voltage applied between the actuator electrode 2 and the curved cantilever beam 5 to provide an electrical contact between the cantilever beam 5 and the output electrode 4 of the nano-electromechanical switch 1.

In the method according to the present invention the motion direction angle β in FIG. 3, between the direction of motion DOM of the curved cantilever beam 5 around the point of rotation POR and the surface of the curved cantilever beam 5 facing the actuator electrode 2, can be calculated and designed such that after rotation of the curved cantilever beam 5 the remaining gap between the curved cantilever beam 5 and the actuator electrode 2 is substantially uniform along the cantilever beam 5 and the actuator electrode 2.

In a further embodiment of the present invention shows the motion direction angle β between the direction of motion DOM of the curved cantilever beam 5 and around the point of rotation POM and the surface of the curved cantilever beam 5 facing the actuator electrode 2 is calculated and designed such that after rotation of the curved cantilever beam 5 the remaining gap between the curved cantilever beam 5 and the actuator electrode 2 is substantially constant.

In a further embodiment present invention the remaining gap between the curved cantilever beam 5 and the actuator electrode 2 is exactly constant.

In a further embodiment of the present invention the method of the motion direction angle β between the direction of motion of the curved cantilever beam 5 around the point of rotation POR and the surface of the curved cantilever beam 5 facing the actuator electrode 2 is maintained substantially constant.

In a further embodiment of the present invention the motion direction angle β is maintained exactly constant.

The present invention provides a much simpler and smaller rotation based nano-electromechanical switch 1 results in a much compactor design in comparison to conventional nano-electromechanical switches. FIG. 3 shows an aspect of the present invention which shows an optimized design of a cantilever beam 5 rotating around a soft spring element placed in the anchor region of the input source electrode 3. The remaining portions of the cantilever beam 5 are designed to be stiff in order to avoid a catastrophic pull-in of the cantilever beam 5 onto the actuator electrode 2. A normal angle α=60° results in the lowest electrical field E. For a rotation based switch, the design can be transferred into the Cartesian coordinate system resulting in the following equation:

$$\alpha_i = 60° - \arctan\left(\frac{y_i}{x_i}\right) \tag{4}$$

where the arctan(y/x) is the correction for the rotation of the coordinate system along the beam and 60° is the fixed angle as would be seen in the Cartesian coordinate system.

In a further embodiment of the present invention the method the Cartesian coordinates (x, y) of the curved cantilever beam 5 from the actuator electrode 2 are calculated iteratively starting from outermost line segment at the tip portion 5c of the curved cantilever beam 5 by using the following equations:

$$x_i = x_{i-1} - \sin(\alpha_{i-1}) \cdot l_s \tag{5}$$

$$y_i = y_{i-1} - \sin(\alpha_{i-1}) \cdot l_s \tag{6}$$

where α is a normal angle between the direction normal of the direction of motion DOM of the curved cantilever beam 5 around the point of rotation POR and the surface of the cantilever beam 5 facing the actuator electrode 2 and where $l_S$ is a predetermined line segment length. The line segment length $l_S$ defines the distance between two points in the iterative calculation of the Cartesian coordinates of the curved cantilever beam 5 along the actuator electrode 2. Using this approach, the shape of the cantilever beam 5 along the actuator electrode 2 can be obtained in the Cartesian coordinate system.

The radius r becomes about half of the maximum radius R and the motion of the cantilever beam 5 is small close to the anchor of the cantilever beam, for example, close to the fixed source electrode 3. Therefore the switch design does not need to follow the 30° design rule. When the angle between the lower cantilever beam surface and the direction of motion DOM is 30°, which is optimal, this results in a gap of 0, 5 times the initial gap at the free end of the cantilever beam 5. This forms at the same time of an optimal configuration for minimal energy dissipation in the gap.

In a further embodiment of the present invention, achieving a constant remaining gap between the curved cantilever beam 5 and the actuator electrode 2 the normal angle α is adapted for each line segment as follows:

$$\cos(\alpha) = \frac{-r \cdot \text{ratio} + R}{R} \quad (7)$$

where ratio is the closed state to open state gap ratio, R is a maximum radius of the curved cantilever beam 5 at its tip portion and radius r is the distance between the surface intersection point P of the curved cantilever beam 5 facing the actuator electrode 2 from the point of rotation POM. In this embodiment, following the trigonometric reasoning, the angle α needs to also be corrected due to the rotation of the coordinate system in each line segment.

Figures 4A, 4B:
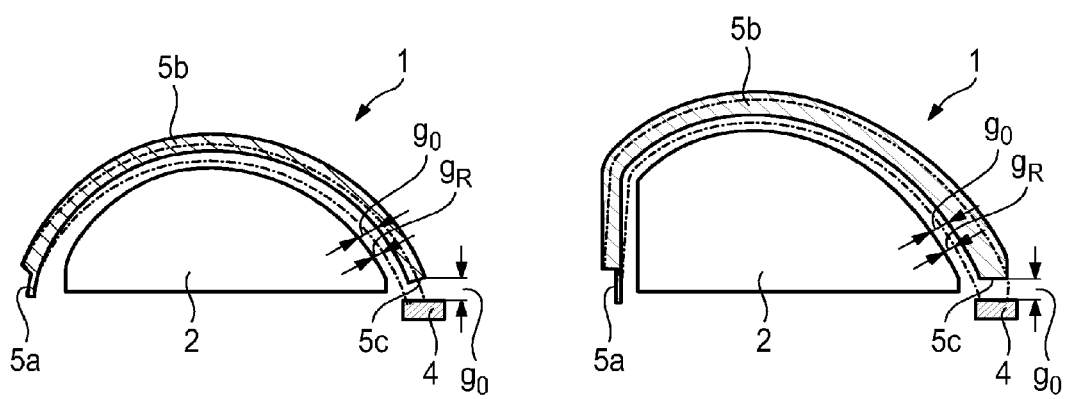
FIG. 4A shows a nano-electromechanical switch with a gap ratio of 1/3 according to a further embodiment of the present invention.
FIG. 4B shows a nano-electromechanical switch with a gap ratio of 2/3 according to a further embodiment of the present invention.

Using the approach, the size of the nano-electromechanical switch 1 can be reduced further as illustrated in FIGS. 4A and 4B. FIG. 4A shows a nano-electromechanical switch design with a gap ratio of 1/3 while FIG. 4B shows a design with a larger gap ratio of 2/3. Direct comparison of the two designs shown in FIGS. 4A and 4B in terms of shape is given in FIG. 5.

Figure 5:
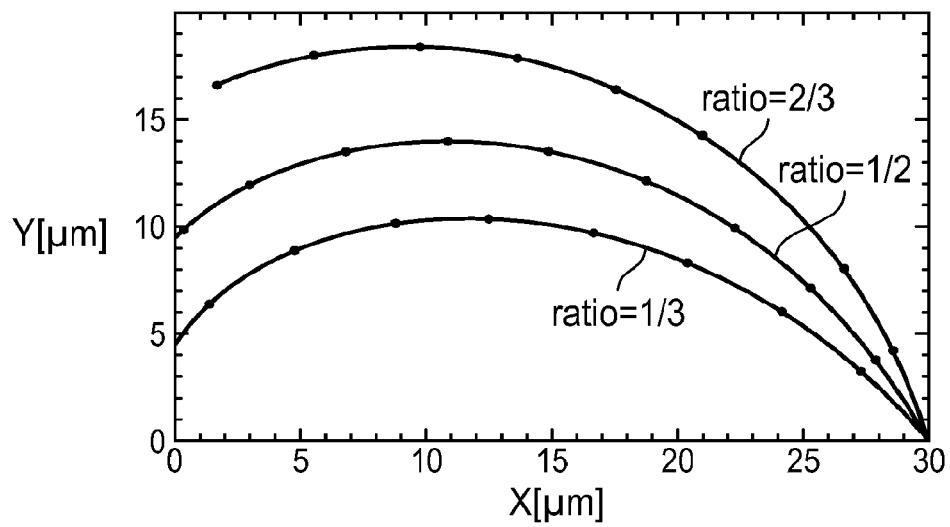
FIG. 5 shows a possible switch designs for different closed state actuation gap ratios for a nano-electromechanical switch according to a further embodiment of the present invention.

FIG. 5 shows a switch design with different closed state actuation gap ratios. The largest design has a ratio of ratio=2/3 corresponding to FIG. 4B. FIG. 5 illustrates designs with a ratio of ratio=1/2 and ratio=1/3. The ratio=1/3 corresponds to the design shown in FIG. 4A. FIGS. 4A and 4B show the trade-off between stability and size of the nano-electromechanical switch 1.

Figure 1A:
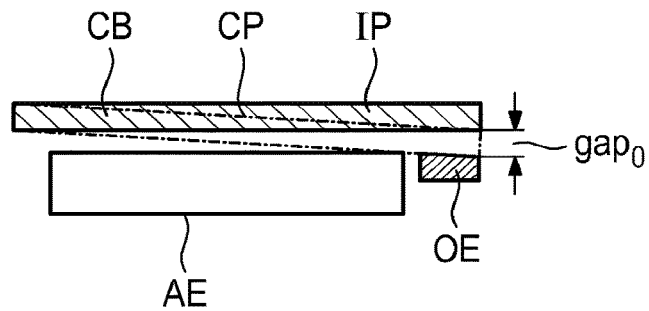
FIG. 1A shows conventional electromechanical switch having a straight beam.
Figure 1B:
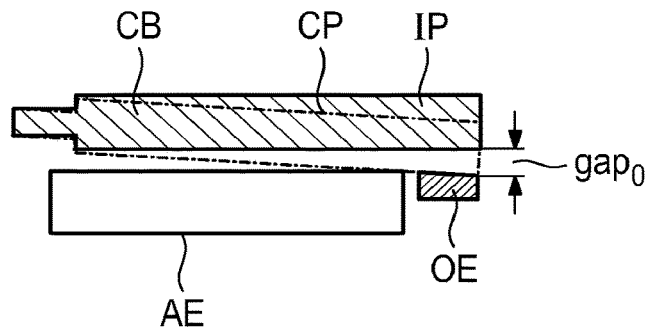
FIG. 1B shows another conventional electromechanical switch having a straight beam.
Figure 2:
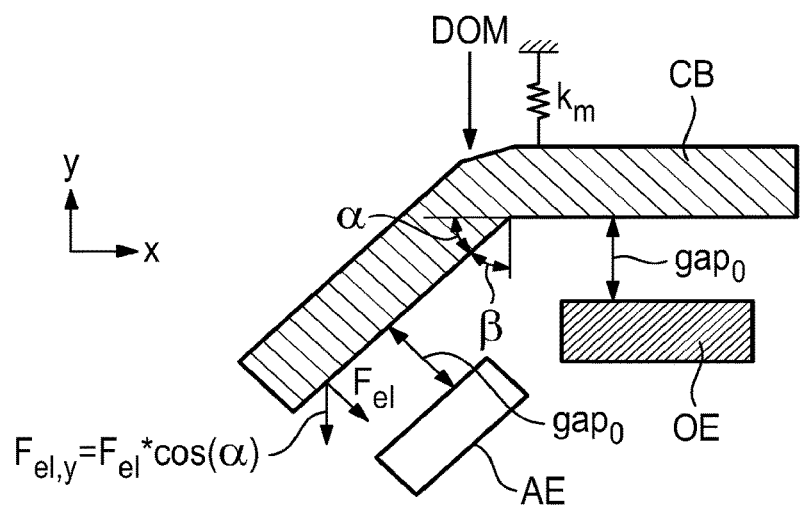
FIG. 2 shows a conventional nano-electromechanical switch having an inclined actuation electrode.
Figure 6:
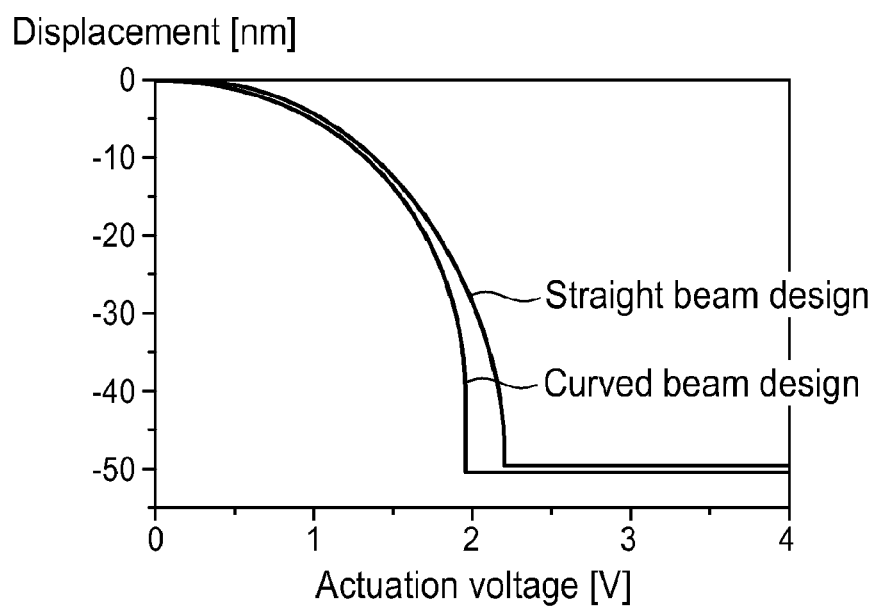
FIG. 6 shows a simulated pull-in voltage and breakdown voltage for a curved beam design according to a further embodiment of the present invention.

FIG. 6 shows the comparison of simulation results obtained using a finite element method. FIG. 6 compares a conventional straight cantilever design with a curved cantilever beam design according to the present invention. The switches have been designed to show a similar value for the pull-in voltage and clearly demonstrate the advantage of the controlled gap in terms of the increased breakdown voltage. The conventional cantilever structure as shown in FIG. 1A breaks down at a voltage of 2, 8 V while the curved cantilever beam 5 used by the nano-electromechanical switch 1 according to the present invention remains stable beyond 4 V with respect to the actuator electrode 2.

In a further embodiment of the present invention the relative position of the curved cantilever beam 5, for example, the distance from the anchor 3, can be considered to adjust an optimal angle. Another aspect of the present invention, this can be avoided to create a nano-electromechanical switch 1 with a constant angle between the lower surface of the cantilever beam 5 and the direction of motion DOM.

Figure 7A:
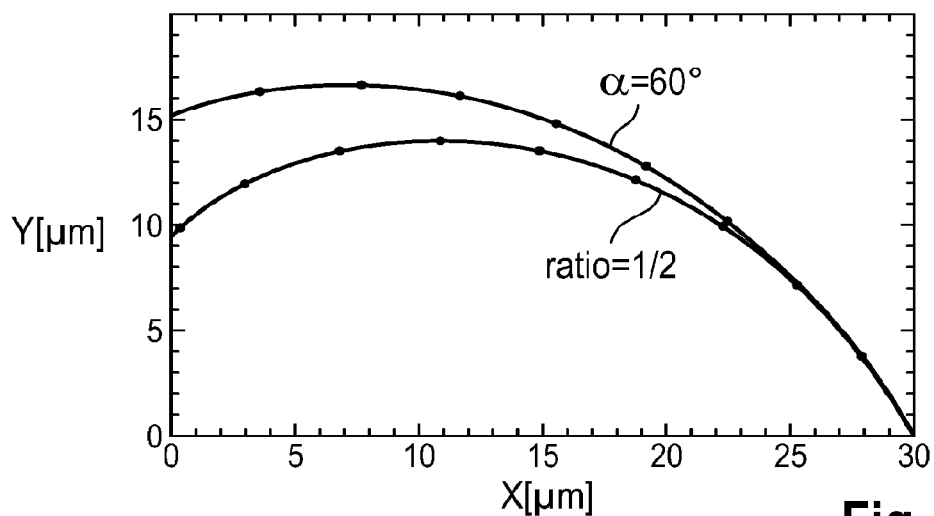
FIG. 7A shows a fully optimized nano-electromechanical switch according to a further embodiment of the present invention.

FIG. 7A shows a design with a fully optimized design compared to the previous embodiments of the present invention. FIG. 7A shows a comparison of a design for a constant remaining gap CSAG design and a constant angle design calculated with an initial angle β of 30°. Although the nano-electromechanical switch 1 with a constant angle α, for example, 60°, is slightly larger the basic concept of the design, is equal so that good results can be obtained with this design approach as well. It is possible to combine both approaches when combining the curved cantilever beam 5.

Figure 7B:
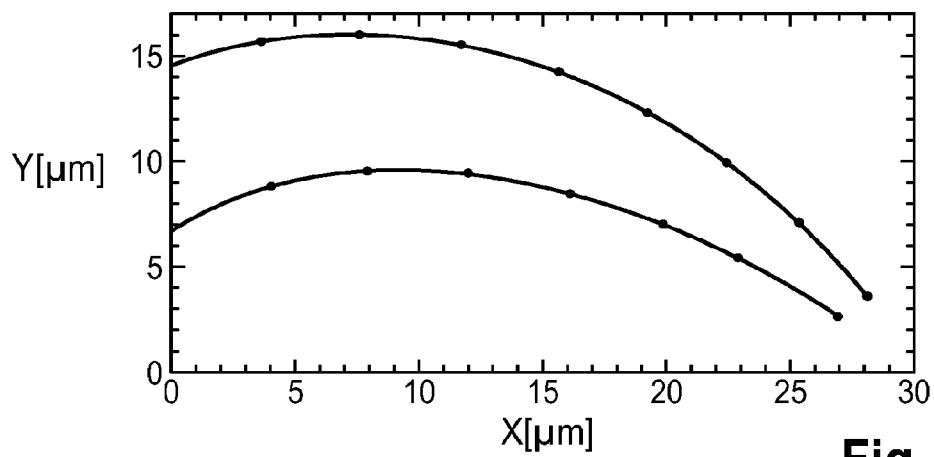
FIG. 7B shows a nano-electromechanical switch that is decreased in size according to a further embodiment of the present invention.

FIG. 7B shows the possibility to decrease the size of the nano-electromechanical switch 1 by decreasing the angle and consequently the robustness similar to a constant CSAG design. FIG. 7B illustrates two possible designs, one with an angle of 30° and the other with an angle of 50° illustrating a trade-off between size and robustness of the nano-electromechanical switch 1 according to the present invention.

Figure 8:
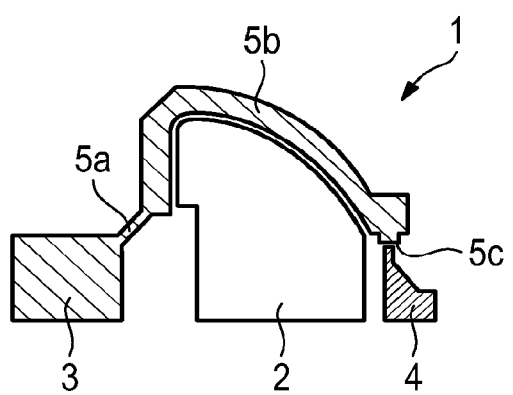
FIG. 8 shows a nano-electromechanical switch that utilizes a constant angle approach according to a further embodiment of the present invention.

FIG. 8 shows a further embodiment of the present invention of the nano-electromechanical switch 1 based on the constant angle approach with an angle β of 30° as in FIGS. 7A and 7B. The nano-electromechanical switch 1 is designed to describe a rotation around a spring element formed by the hinge portion 5a of the curved cantilever beam 5. The actuation electrode 2 is designed towards the tip portion 5c using the 30 degree rule approach.

The method according to the present invention can be implemented by a design tool including a computer program having instructions for performing the method for designing a nano-electromechanical switch 1 where the motion direction angle β between the direction of motion DOM of the curved cantilever beam 5 around the point of rotation POR and the surface of the curved cantilever beam 5 facing the actuator electrode 2 is calculated such that after rotation of the curved cantilever beam 5 the remaining gap between the curved cantilever beam 5 and the actuator electrode 2 is substantially uniform. Consequently, the electric field E between the curved cantilever beam 5 and the actuator electrode 2 is also uniform.

FIGS. 3, 4A, 4B, and 8 show different possible implementations of a nano-electromechanical switch 1 according to the present invention that are only exemplary and can be varied. There are other possible implementations of the nano-electromechanical switch 1 according to the present invention. In the implementations shown in FIGS. 3, 4A, 4B, and 8 the point of rotation POR is formed by a flexible hinge portion 5a of the curved cantilever beam 5.

In a further embodiment of the present invention the point of rotation POR can be formed by other elements, for example, by a flexible spring element connecting the input source electrode 3 with the main body portion 5b of the curved cantilever beam 5. It is possible to interchange the input electrode 3 with the output electrode 4.

In a further embodiment of the present invention the input electrode 3 or the actuation electrode 2 can be applied to a reference potential. It is possible that the tip portion 5c of the curved cantilever beam 5 is flat as shown in FIG. 3 or has a contact tip as shown in FIG. 8. The thickness of the main body portion 5b of the curved cantilever beam 5 can vary. The thickness of the main body portion 5b of the cantilever beam 5 is thicker than the thickness of the flexible hinge portion 5a as shown in FIGS. 3, 4A, 4B, and in FIG. 8.

In a further embodiment of the present invention the initial gap between the curved cantilever beam 5 and the actuator electrode 2 can be by a sacrificial layer used during fabrication of the nano-electromechanical switch 1. The thickness of the sacrificial layer defining the initial gap between the curved cantilever beam 5 and the actuator electrode 2 can also vary depending on the desired performance of the nano-electromechanical switch 1. In the embodiments of the nano-electromechanical switch 1, referring to FIGS. 3, 4A, 4B, and 8, the curved cantilever beam 5 is formed by a solid electrical conductive material or any other material with an incorporated conductive path.

In a further embodiment of the present invention the curved cantilever beam 5 can include holes to diminish its inertia and to increase the switching speed of the nano-electromechanical switch 1.

Figure 9:
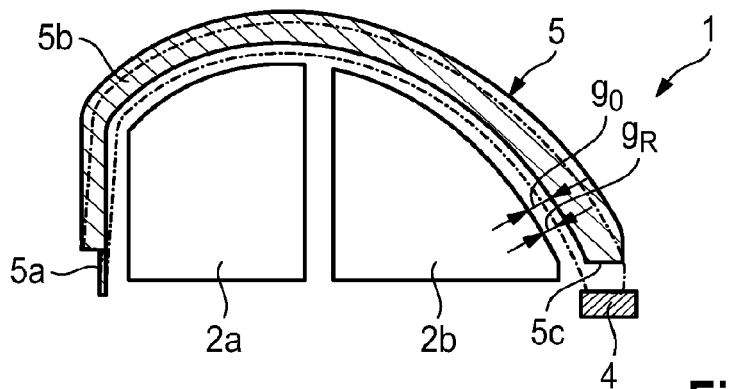
FIG. 9 shows a nano-electromechanical switch with two or more actuation electrodes according to a further embodiment of the present invention.

FIG. 9 shows a further embodiment of the present invention of the nano-electromechanical switch as represented in FIGS. 5, 7A, and 7B with two or more actuation electrodes acting in the same direction. The actuation electrodes 2a and 2b of the nano-electromechanical switch 1 are designed to enable logic operations directly in the electromechanical domain. In a further embodiment of the present invention the stiffness of the mechanical system is designed such that only a combined actuation of the two actuation electrodes 2a and 2b result in a sufficient motion of the curved cantilever tip 5c to form a contact with the output electrode 4, thus forming logical functions such as NAND and AND. In a further embodiment of the present invention the stiffness of the mechanical system is designed such that a single actuation electrode 2a and 2b results in a sufficient motion of the curved cantilever tip 5c to form a contact with the output electrode 4, thus forming the logical functions such as NOR and OR.

Figure 10:
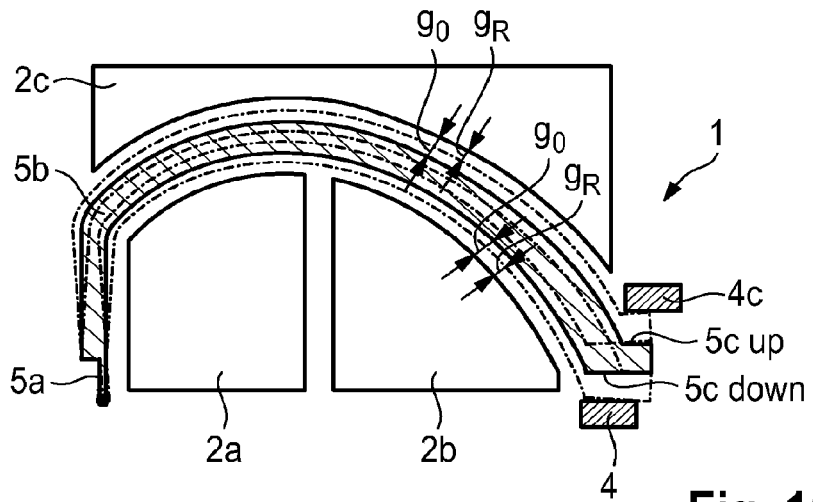
FIG. 10 shows a nano-electromechanical switch with two or more actuation electrodes acting in opposite directions according to a further embodiment of the present invention.

FIG. 10 shows a further embodiment of the present invention of the nano-electromechanical switch 1 as represented in FIGS. 5, 7A, and 7B with two or more actuation electrodes acting in opposite directions. The motion direction angle β is designed such that after rotation of the curved cantilever beam 5 the remaining gap CSAG between the curved cantilever beam 5 and the upper or lower actuator electrode 2c, 2a and 2b is substantially constant for motions towards any of the actuator electrodes. The actuation electrodes 2a and 2b of the nano-electromechanical switch are designed to enable logic operations directly in the electromechanical domain. In a further embodiment of the present invention, the upper electrode 2c is designed such that it dominates the electromechanical system and that it can always pull the tip 5c-up of the curved cantilever beam 5 towards an upper output electrode 4c. The at least one lower electrode 2a, 2b can only pull the curved cantilever beam 5 and the other tip 5c-down of the curved cantilever beam 5 towards the lower output electrode 4 when the potential between the upper actuation electrode 2c and the curved cantilever beam 5 is zero. This electrode configuration can be used for logic functions such as of XNOR and XOR.

Figure 11:
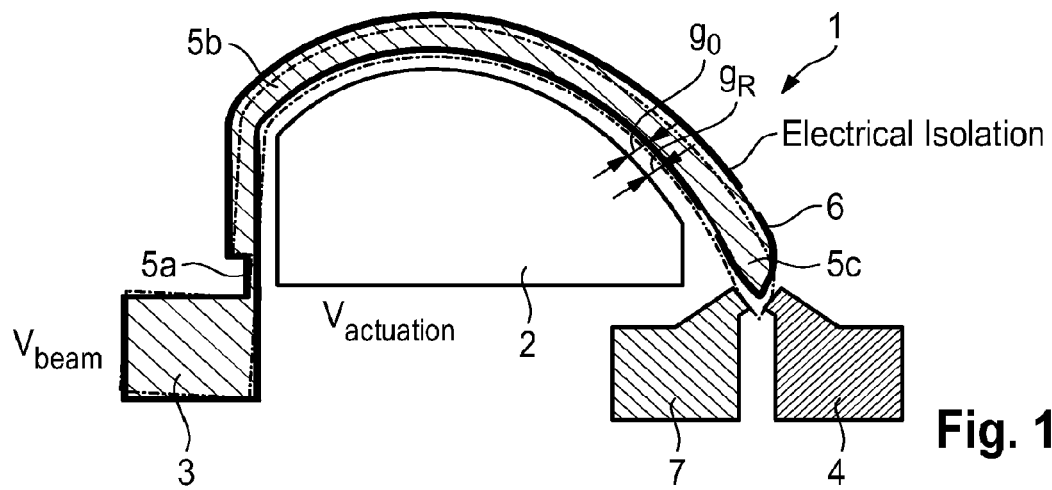
FIG. 11 shows a nano-electromechanical switch with an electrically isolated tip forming a switch with four or more terminals according to a further embodiment of the present invention.

FIG. 11 shows a further embodiment of the present invention of a nano-electromechanical switch 1 as represented in FIGS. 5, 7A, 7B, 9, and 10 with an electrically isolated tip forming a switch with four or more terminals. In a further embodiment of the present invention, the nano-electromechanical switch 1 is formed of an electrically isolating material and the conductive path necessary for the electrostatic actuation of the curved cantilever beam 5 including at its tip end 5c an additional conductive layer 6 being isolated from the fixed anchor 3 as shown in FIG. 11. The fixed anchor 3 is forms a beam potential electrode while an additional input terminal forms a source input electrode 7. In this configuration the actuation of the curved cantilever beam 5 is independent of the potential of the source input electrode 7 and the potential of output electrode potential 4.

In a further embodiment of the present invention the method for designing a nano-electromechanical switch a normal angle is kept substantially constant along the actuator electrode.

In a further embodiment of the present invention the method for designing a nano-electromechanical switch the normal angle is kept at about 60 degrees starting from the tip of the cantilever beam along a main body portion of the cantilever beam until the distance of the surface point of the cantilever beam facing the actuator electrode from the point of rotation becomes about half of the maximum radius of the curved cantilever beam being the distance between the tip of the cantilever beam and the point of rotation.

What is claimed is:

1. A nano-electromechanical switch, comprising:
   at least one actuator electrode having a surface with a first curvature extending along at least a majority of a length of the at least one actuator electrode; and
   a curved cantilever beam having a main body portion with a second curvature along a majority of its length that substantially matches said first curvature of the at least one actuator electrode, wherein the main body portion of the curved cantilever beam is curved without an application of an activation voltage to provide a uniform gap separating the at least one actuator electrode from the curved cantilever beam prior to actuation, wherein said curved cantilever beam flexes in response to an activation voltage applied between said actuator electrode and said curved cantilever beam to provide an electrical contact between said curved cantilever beam and an output electrode of said nano-electromechanical switch, wherein a flexible hinge portion of said curved cantilever beam connects said curved cantilever beam with an input electrode of said nano-electromechanical switch, wherein said flexible hinge portion is less stiff than said main body portion of said curved cantilever beam so that the motion of the curved cantilever beam approximates a rotation around said flexible hinge portion and forms said point of rotation.

2. The nano-electromechanical switch according to claim 1, wherein a motion direction angle between a direction of motion of said curved cantilever beam around a point of rotation and a surface of said curved cantilever beam facing said actuator electrode is configured so that after rotation of said curved cantilever beam the remaining gap between said curved cantilever beam and said actuator electrode is constant.

3. The nano-electromechanical switch according to claim 2, wherein said motion direction angle between a direction of motion of said curved cantilever beam around said point of rotation and a surface of said curved cantilever beam facing said actuation electrode is constant.

4. The nano-electromechanical switch according to claim 2, wherein said cantilever beam comprises said flexible hinge portion.

5. The nano-electromechanical switch according to claim 2, wherein said main body portion being mechanically stiffer than said hinge portion and performing a circular motion around said flexible hinge portion in response to said activation voltage applied between said actuation electrode and said curved cantilever beam.

6. The nano-electromechanical switch according to one claim 1, wherein an initial gap between said curved cantilever beam and said actuator electrode is determined by a thickness of a sacrificial layer used during fabrication of said nano-electromechanical switch.

7. The nano-electromechanical switch according to claim 3, wherein the motion direction angle between the direction of motion of said curved cantilever beam around said point of rotation and the surface of said curved cantilever beam facing the actuator electrode is along the main body portion of said curved cantilever beam and is equal to 30 degrees.

8. A method for designing a nano-electromechanical switch, comprising:
   adapting a curved cantilever beam to rotate around a point of rotation in response to an activation voltage applied between an actuator electrode and said curved cantilever beam, the at least one actuator electrode having a first curvature extending along a length of the at least one actuator electrode, and the curved cantilever beam having a main body portion with a second curvature that substantially matches the first curvature to provide a closed state actuation gap (CSAG) between the at least one actuator and the main body portion that is uniform along its length prior to actuation, wherein said second curvature is present in said main body portion without the application of the activation voltage, wherein a motion direction angle between a direction of motion of said curved cantilever beam around said point of rotation and a surface of said curved cantilever beam facing said actuator electrode is configured so that after rotation of said curved cantilever beam the remaining gap between said curved cantilever beam and said actuator electrode is uniform; and providing an electrical contact between said curved cantilever beam and an output electrode of said nano-electromechanical switch.

9. The method for designing a nano-electromechanical switch according to claim 8, wherein the motion direction angle between the direction of motion of said curved cantilever beam around said point of rotation and the surface of said curved cantilever beam facing that actuator electrode is maintained constant.

10. The method for designing a nano-electromechanical switch according to claim 8, wherein Cartesian coordinates (x, y) of the curved cantilever beam alone the actuator electrode are calculated iteratively starting from an outermost line segment at a tip (x0, y0) of said curved cantilever beam by using the following equations:

wherein $\alpha_{i-1}$ is a normal angle between a direction normal of the direction of motion of said curved cantilever beam around said point of rotation and the surface of said cantilever beam facing said actuator electrode, and lS is a predetermined line segment length.

11. The method for designing a nano-electromechanical switch according to claim 8, wherein for achieving a constant remaining gap between said curved cantilever beam and said actuator electrode the normal angle is adapted for each line segment as follows:

wherein the ratio is the ratio of a closed state to an open state gap, R is a maximum radius of the curved cantilever beam at its tip and r is a distance of a surface intersection point of said curved cantilever beam facing said actuator electrode from a point of rotation.

12. The method for designing a nano-electromechanical switch according to claim 9, wherein the normal angle is kept constant along the actuator electrode.

13. The method for designing a nano-electromechanical switch according to claim 12, wherein the normal angle is kept at about 60 degrees starting from the tip of said cantilever beam along a main body portion of said cantilever beam until the distance of the surface intersection point of said cantilever beam facing said actuator electrode from the point of rotation becomes about half of the maximum radius of said curved cantilever beam being a distance between the tip of said cantilever beam and the point of rotation.

14. A computer readable non-transitory article of manufacture tangibly embodying computer readable instructions which, when executed, cause a computer to carry out the steps of a method, comprising:

adapting a curved cantilever beam to rotate around a point of rotation in response to an activation voltage applied between an actuator electrode and said curved cantilever beam, the at least one actuator electrode having a first curvature extending along a length of the at least one actuator electrode, and the curved cantilever beam having a main body portion with a second curvature that substantially matches the first curvature to provide a closed state actuation gap (CSAG) between the at least one actuator and the main body portion that is uniform along its length prior to actuation, wherein said second curvature is present in said main body portion without the application of the activation voltage, wherein a motion direction angle between a direction of motion of said curved cantilever beam around said point of rotation and a surface of said curved cantilever beam facing said actuator electrode is configured so that after rotation of said curved cantilever beam the remaining gap between said curved cantilever beam and said actuator electrode is uniform; and providing an electrical contact between said curved cantilever beam and an output electrode of said nano-electromechanical switch.

15. The computer readable non-transitory article of claim 14, wherein the motion direction angle between the direction of motion of said curved cantilever beam around said point of rotation and the surface of said curved cantilever beam facing that actuator electrode is maintained constant.

16. The computer readable non-transitory article of claim 14, wherein Cartesian coordinates (x, y) of the curved cantilever beam alone the actuator electrode are calculated iteratively starting from an outermost line segment at a tip (x0, y0) of said curved cantilever beam by using the following equations:

wherein $\alpha_{i-1}$ is a normal angle between a direction normal of the direction of motion of said curved cantilever beam around said point of rotation and the surface of said cantilever beam facing said actuator electrode, and lS is a predetermined line segment length.

17. The computer readable non-transitory article of claim 15, wherein the normal angle is kept constant along the actuator electrode.

* * * * *